United States Patent [19]

Mahabadi

[11] Patent Number: 5,013,935
[45] Date of Patent: May 7, 1991

[54] CMOS LEVEL DETCTOR CIRCUIT.

[75] Inventor: John K. Mahabadi, Tempe, Ariz.

[73] Assignee: Motorola, Inc., Schaumburg, Ill.

[21] Appl. No.: 451,899

[22] Filed: Dec. 18, 1989

[51] Int. Cl.⁵ .............................................. H03K 5/153
[52] U.S. Cl. .................................... 307/350; 307/354; 307/363; 307/303
[58] Field of Search ............... 307/585, 451, 350, 362, 307/272.3, 363, 354, 303, 303.1, 303.2

[56] References Cited

U.S. PATENT DOCUMENTS 3,829,713  8/1974  Canning .......................... 307/225 C
4,709,172 11/1987  Williams .............................. 307/585

Primary Examiner—John Zazworsky
Attorney, Agent, or Firm—Michael Bingham; Bradley Botsch

[57] ABSTRACT

A circuit for providing a plurality of output functions at respective outputs by detecting the presence of an unusual voltage applied at its input thereof, comprising input circuit coupled to the input for transferring the input signal to a first output when the input signal is within a predetermined voltage range. A detection circuit coupled to the input for providing a detection signal at an output thereof when the input signal level exceeds a predetermined level in a predetermined sense. A buffer stage coupled between the output of the detection circuit and a second output, responsive to the detection signal, for providing a first binary logic state of the second output.

29 Claims, 1 Drawing Sheet

CMOS LEVEL DETCTOR CIRCUIT

BACKGROUND OF THE INVENTION

The present invention relates to integrated logic circuits and, more particularly, to a CMOS input voltage level detector circuit.

A CMOS integrated circuit is a type of MOSFET integrated circuit which includes both N-channel and P-channel transistors. Furthermore, it is advantageous to increase the functionality of a CMOS integrated circuit without increasing the number of external pins or terminals. Also, it is almost always advantageous to have a circuit wherein its input can provide more than one distinct function.

Prior art has made several attempts at minimizing the number of external pins of an integrated circuit. One attempts has been the sharing of external pins as both an input and output. Another approach for minimizing the number of pins is the use of a trinary input circuit at an input pin. The trinary circuit provides two outputs which provide different output states depending upon whether a logic low or high is applied to the input pin or whether the input pin is left floating. However, this approach is not desirable in CMOS circuitry since floating inputs are not recommended.

Another approach for minimizing the number of pins utilizes circuitry on the integrated circuit to detect when a voltage applied to an input pin is substantially greater than the power supply voltage whereby the detection of such a large voltage forces the circuitry on integrated circuit to function differently than under normal operating conditions. Prior art has implemented this latter approach by connecting an input pin not only to the inputs of conventional logic circuitry, but also to the gate electrode of an on-chip enhancenment mode transistor having a threshold voltage higher than the power supply voltage so that the transistor will remain nonconductive when a normal logic one or logic zero is applied to the input pin, but become conductive when a voltage substantially greater than that of the power supply is applied to the input. However, the application of an unusually high voltage to an input pin is impractical because there is typically an on chip diode connected between the input pin and the CMOS integrated circuit's power supply node. Therefore, the diode will prevent the input voltage from being taken to voltage substantially more positive than the most positive power supply of the circuit.

Hence, a need exists for a CMOS level detector circuit that will increase the functionality of an integrated circuit without increasing the number of external pins or terminals.

SUMMARY OF THE INVENTION

Accordingly, it is an object of the present invention to provide an improved circuit that increases the functionality of an integrated circuit without increasing the number of pins or terminals of the integrated circuit.

Another object of the present invention is to provide a circuit that detects the presence of an unusual voltage applied at an input.

In carrying out the above and other objects of the present invention, there is provided a circuit for providing a plurality of output functions at respective outputs responsive to a voltage input signal applied to an input thereof, comprising an input circuit coupled to the input for transferring the input signal to a first output when the input signals is within a predetermined voltage range; a detection circuit coupled to the input for providing a detection signal at an output thereof when the input signal level exceeds a predetermined level in a predetermined sense; and a buffer stage coupled between the output of the detection circuit and a second output, responsive to the detection signal, for providing a first binary logic state of the second output.

The above and other objects, features and advantages of the present invention will be better understood from the following detailed description taken in conjunction with the accompanying drawings.

DETAILED DESCRIPTION OF THE INVENTION

Figure 1:
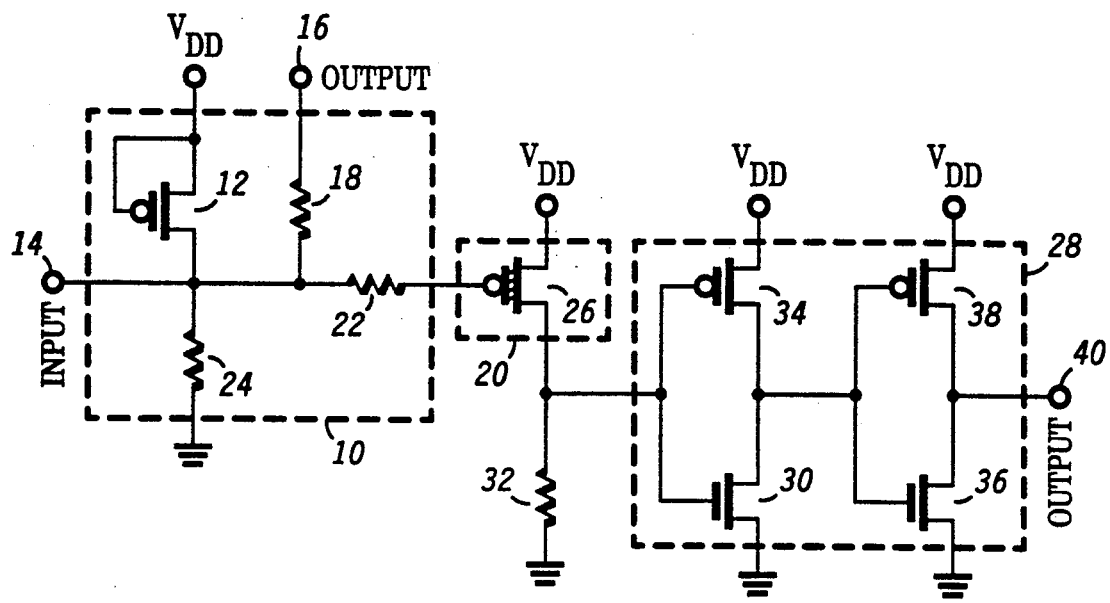
FIG. 1 is a schematic diagram illustrating the preferred embodiment of the present invention.

Referring to FIG. 1, there is illustrated a detailed schematic diagram of the preferred embodiment of the present invention comprising input circuit 10 which includes P-channel enhancement mode transistor 12 having a source coupled to a first supply voltage terminal at which the operating potential $V_{dd}$ is applied, a gate coupled to its source and a drain coupled to input 14 which may be an external terminal or pin of an integrated circuit. The drain of P-channel enhancement mode transistor 12 is also coupled to output 16 by P-type resistor 18, to an input of detection circuit 20 by P-type resistor 22, and to a second supply voltage terminal at which groud potential is applied by P-type resistor 24.

The preferred embodiment of the present invention further comprises detection circuit 20 which includes P-channel field oxide device transistor 26 having a source coupled to operating potential $V_{dd}$, a gate coupled to the input of detection circuit 20, and a drain coupled to an output of detection circuit 20. As is known, a P-channel field oxide device transistor is characterized by having a much thicker oxide region than typical transistors thereby requiring a large negative gate-source voltage, $V_{GS}$, to reach conduction. For example, a typical P-channel field oxide device transistor may have an oxide thickness of 8,000 Angstroms with a threshold voltage, $V_T$, of $-12$ volts.

The preferred embodiment of the present invention further yet comprises buffer circuit 28 which includes an N-channel enhnancement mode transistor 30 having a source returned to ground reference, a gate coupled to the output of detection circuit 20, and a drain coupled to the drain of P-channel enhancement mode transistor 34. The gate of P-channel enhancement mode transistor 34 is coupled to the gate of N-channel enhancement mode transistor 30 while the former has a source coupled to operating potential $V_{dd}$. N-channel enhancement mode transistor 36 has a source returned to ground reference, a gate coupled to the drain of N-channel enhancement mode transistor 30 and to the gate of P-channel enhancement mode transistor 38, and a drain coupled to the drain of P-channel enhancement mode transistor 38 and to output terminal 40. The source of P-channel enhancement mode transistor 38 is coupled to operating potential $V_{dd}$. Furthermore, it is known that the substrate of all P-channel transistors is typically coupled to the most positive supply voltage terminal, while the substrate of all N-channel transistors is typically coupled to the most negative supply voltage terminal.

The preferred embodiment of the present invention even further includes pull down resistor 32 coupled between the gates of P-channel enhancement mode transistor 34 and N-channel enhancement mode transistor 30 and ground reference.

The present invention is functionally equivalent to the invention described in U.S. Pat. No. 4,709,172, entitled "INPUT-VOLTAGE DETECTOR CIRCUIT FOR CMOS INTEGRATED CIRCUIT", in the name of Clark R. Williams. However, the method and components are quite different as will be described below.

In operation, when the voltage at input 14 is within a predetermined voltage range, that is between operating potential $V_{dd}$ and ground reference, the signal applied at input 14 appears at output 16 via P-type resistor 18. Resistor 24 is used as a pull down resistor for output 16 while resistors 18 and 22 as well as P-channel enhancement mode transistor 12 are all used for current limiting and electrostatic discharge (ESD) protection. Furthermore, P-channel field oxide device transistor 26 is turned off which constitutes output 40 a logic low ("0"). Thus, for input signals within a predetermined voltage range, output 16 follows the signal at input 14 and performs a first predetermined function while output 40 is maintained at a logic low.

However, when the voltage at input 14 exceeds a predetermined level in a predetermined sense, such that the voltage at input 14 goes negative allowing the gate-source voltage, $V_{GS}$, of P-channel field oxide device transistor 26 to become more negative than a predetermined threshold voltage, P-channel field oxide device transistor 26 turns on and produces a voltage near the operating potential $V_{dd}$ at its drain. The voltage at the drain of P-channel field oxide device transistor 26 is then transformed to output 40 via buffer circuit 28. A voltage near $V_{dd}$ (logic "1") appearing at output 40 signifies that an unusually large negative voltage has occurred at input 14. Furthermore, the existence of a logic "1" at output 40 will be used to perform a second predetermined function, such as enabling the tuning of a crystal oscillator. Also, for this scenerio, P-type resistors 18, 22 and 24 as well as P-channel enhancement mode transistor 12 all function as reversed biased diodes for large negative voltages at input 14 and, thus, output 16 will remain static at a logic "0" or "1", depending upon the external circuitry coupled thereto. Therefore for large negative voltage signals occurring at input 14 such that P-channel field oxide device transistor 26 turns on and becomes conductive, output 40 becomes a logic high and performs a second predetermined function while output 16 remains in a static state.

Figure 2:
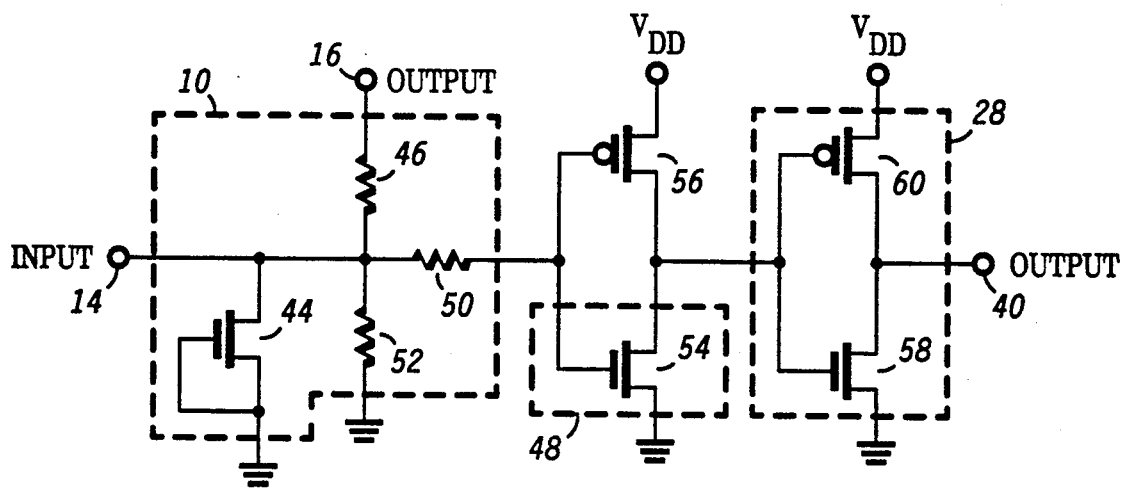
FIG. 2 is a schematic diagram illustrating another embodiment of the present invention.

Referring to FIG. 2, another embodiment of the present invention, the components that are similar to those of FIG. 1 have been designated by the same reference numerals. The circuit of FIG. 2 comprises input circuit 10 which includes N-channel enhancement mode transistor 44 having a source coupled to a first supply voltage terminal at which ground potential is applied, a gate coupled to its source and a drain coupled to input 14, to output 16 by N-type resistor 46, to the input of detection circuit 48 by N-type resistor 50, and returned to ground reference by N-type resistor 52.

The circuit of FIG. 2 further comprises detection circuit 48 which includes N-channel field oxide device transistor 54 having a source returned to ground reference, a gate coupled to the input of detection circuit 48, and a drain coupled to the output of detection circuit 48. As is known, similar to the P-channel field oxide device transistor, an N-channel field oxide device transistor has a much thicker oxide region than typical transistors; however, N-channel field oxide device transistors require a large positive gate-source voltage to reach conduction, such as a threshold voltage of +12 volts.

The circuit of FIG. 2 further yet comprises buffer circuit 28 which N-channel enhancement mode transistor 58 has a source returned to ground reference, a gate coupled to the output of detection circuit 48 and to the gate of P-channel enhancement mode transistor 60, and a drain coupled to output terminal 40 and to the drain of P-channel enhancement mode transistor 60. The source of P-channel enhancement transistor 60 is coupled to operating potential $V_{dd}$.

The circuit of FIG. 2 even further includes P-channel enhancement mode transistor 56 for providing a load for N-channel field oxide device transistor 54 and having a source coupled to operating potential $V_{dd}$, a gate coupled to the gate of N-channel field oxide device transistor 54, and a drain coupled to the output of detection circuit 48.

As before, whenever the voltage at input 14 is within a predetermined voltage range, that is between operating potential $V_{dd}$ and ground reference, the signal applied at input 14 appears at output 16 via resistor 46. Resistor 52 is used as a pull down resistor for output 16 while resistors 46 and 50 are used for current limiting and electrostatic discharge (ESD) protection. Furthermore, N-channel field oxide device transistor 54 is turned off which constitutes output 40 to a logic low ("0"). Thus, for input signals within a predetermined voltage range, output 16 follows the signal at input 14 and performs a first predetermined function while output 40 is maintained at a logic low.

However, when the voltage at input 14 exceeds a predetermined level in a predetermined sense, such that the voltage at input 14 goes positive allowing the gate-source voltage, $V_{GS}$, of N-channel field device transistor 54 to become more positive than a predetermined threshold voltage, N-channel field oxide device transistor 54 turns on and produces a voltage near ground potential at its drain. The voltage at the drain of N-channel field oxide device transistor 54 is then transformed to output 40 via buffer circuit 28 such that buffer circuit 28 performs a logic inversion of the logic signal at the drain of N-channel field oxide device transistor 54 thereby producing a logic "1" at output 40. Similar to the circuit in FIG. 1, a logic "1", that is a voltage near $V_{dd}$, appearing at output 40 signifies that an unusually large positive voltage has occurred at input 14. Furthermore, the existence of a logic "1" at output 40 will be used to perform a second predetermined function. P-channel enhancement mode transistor 56 provides a load for N-channel field oxide device transistor 54. Also, for this scenario, N-type resistors 46, 50 and 52 as well as N-channel enhancement mode transistor 44 are all reversed biased for large positive voltages at input 14 and, thus, output 16 will remain static at a logic "0" or "1", depending upon the external circuitry coupled thereto. Therefore, for large positive voltage signals occurring at input 14 such that N-channel field oxide device transistor 54 turns on and becomes conductive output 40 will go high and become a logic "1" and perform a second predetermined function while output 16 will remains in a static state.

By now it should be appreciated that there has been provided a novel circuit that successfully increases the functionality of an integrated circuit without increasing the number of external pins or terminals. Furthermore, a novel circuit has been provided which has an input that can provide a plurality of output functions at respective outputs.

I claim:

1. A voltage level detector circuit for providing a plurality of output functions responsive to a voltage input signal applied to an input thereof, comprising:
   input means coupled to the input for transferring the voltage input signal to a first output of the voltage level detector circuit when the input signal is within a predetermined voltage range;
   detection means including a field oxide device transistor coupled to the input for providing a detection signal at an output thereof responsive when said voltage input signal exceeds a predetermined level in a predetermined sense; and
   a buffer stage coupled between said output of said detection means and a second output of the voltage level detector circuit for providing a first binary logic state at said second output responsive to said detection signal.

2. The voltage level detector circuit according to claim 1 wherein said input means includes:
   a P-channel enhancement mode transistor having a source coupled to a first supply voltage terminal, a gate coupled to said source of said P-channel enhancement mode transistor, and a drain coupled to the input;
   a first resistor coupled between said drain of said P-channel enhancement mode transistor and a second supply voltage terminal;
   a second resistor coupled between the input and said first output; and
   a third resistor coupled between the input and said detection means.

3. The voltage level detector circuit according to claim 2 wherein said detection means includes:
   a P-channel field oxide device transistor having a source coupled to said first supply voltage terminal, a gate coupled to said third resistor, and a drain coupled to said output of said detection means.

4. The voltage level detector circuit according to claim 3 wherein said buffer stage includes:
   a first P-channel enhancement mode transistor having a source coupled to said first supply voltage terminal, a gate coupled to said output of said detection means, and a drain;
   a first N-channel enhancement mode transistor having a source coupled to said second supply voltage terminal, and a gate and drain coupled to said gate and drain of said first P-channel enhancement mode transistor of said buffer stage, respectively;
   a second P-channel enhancement mode transistor having a source coupled to said first supply voltage terminal, a gate coupled to said drain of said first P-channel enhancement mode transistor of said buffer stage, and a drain; and
   a second N-channel enhancement mode transistor having a source coupled to said second supply voltage terminal, a gate coupled to said gate of said second P-channel enhancement mode transistor of said buffer stage, and a drain coupled to said drain of said second P-channel enhancement mode transistor of said buffer stage and to said second output.

5. The voltage level detector circuit according to claim 4 further includes:
   a resistor coupled between said gate of said first P-channel enhancement mode transistor of said buffer stage and said second supply voltage terminal.

6. The voltage level detector circuit according to claim 1 wherein said input means includes:
   An N-channel enhancement mode transistor having a source coupled to a first supply voltage terminal, a gate coupled to said source of said N-channel enhancement mode transistor, and a drain coupled to the input;
   a first resistor coupled between said drain of said N-channel enhancement mode transistor and said first supply voltage terminal;
   a second resistor coupled between the input and said first output; and
   a third resistor coupled between the input and said detection means.

7. The voltage level detector circuit according to claim 6 wherein said detection means includes:
   An N-channel field oxide device transistor having a source coupled to said first supply voltage terminal, a gate coupled to said third resistor, and a drain coupled to said output of said detection means.

8. The voltage level detector circuit according to claim 7 wherein said buffer stage includes:
   a P-channel enhancement mode transistor having a source coupled to said second supply voltage terminal, a gate coupled to said output of said detection means, and a drain; and
   an N-channel enhancement mode transistor having a source coupled to said first supply voltage terminal, a gate coupled to said gate of said P-channel enhancement mode transistor of said buffer stage, and a drain coupled to said drain of said P-channel enhancement mode transistor of said buffer stage and to said second output.

9. The voltage level detector circuit according to claim 8 further includes:
   a P-channel enhancement mode transistor having a source coupled to a second supply voltage terminal, a gate coupled to said gate of said N-channel field oxide device transistor of said detection means, and a drain coupled to said output of said detection means.

10. Integrated voltage level circuit for providing a plurality of output functions at respective outputs responsive to an input signal applied at an input thereof, comprising:
    input means coupled to the input for transferring the input signal to a first output when the input signal is within a predetermined voltage range;
    detection means including a P-channel field oxide device transistor coupled to the input for providing a detection signal at an output thereof responsive to the input signal becoming more negative than a predetermined level; and
    a buffer stage coupled between said output of said detection circuit and a second output for providing a first binary logic state at said second output responsive to said detection signal being at the input.

11. The integrated voltage level according circuit to claim 10 wherein said input means includes:

a P-channel enhancement mode transistor having a source coupled to a first supply voltage terminal, a gate coupled to said source of said P-channel enhancement mode transistor, and a drain coupled to the input;

a first resistor coupled between said drain of said P-channel enhancement mode transistor and a second supply voltage terminal;

a second resistor coupled between the input and said first output; and a third resistor coupled between the input and said detection means.

12. The integrated voltage level circuit according to claim 11 wherein said P-channel field oxide device transistor of said detection means has a source coupled to said first supply voltage terminal, a gate coupled to said third resistor, and a drain coupled to said output of said detection means.

13. The integrated voltage level circuit according to claim 12 wherein said buffer stage includes:

a first P-channel enhancement mode transistor having a source coupled to said first supply voltage terminal, a gate coupled to said output of said detection means, and a drain;

a first N-channel enhancement mode transistor having a source coupled to said second supply voltage terminal, and a gate and drain coupled to said gate and drain of said first P-channel enhancement mode transistor of said buffer stage, respectively;

a second P-channel enhancement mode transistor having a source coupled to said first supply voltage terminal, a gate coupled to said drain of said first P-channel enhancement mode transistor of said buffer stage, and a drain; and a second N-channel enhancement mode transistor having a source coupled to said second supply voltage terminal, a gate coupled to said gate of said second P-channel enhancement mode transistor of said buffer stage, and a drain coupled to said drain of said second P-channel enhancement mode transistor of said buffer stage and to said second output.

14. The integrated voltage level circuit according to claim 13 further includes:

a resistor coupled between said gate of said first P-channel enhancement mode transistor of said buffer stage and said second supply voltage terminal.

15. Integrated voltage level circuit for providing a plurality of output functions at respective outputs responsive to an input signal applied to an input thereof, comprising:

input means coupled to the input for transferring the input signal to a first output when the input signal is within a predetermined voltage range;

detection means including an N-channel field oxide device transistor coupled to the input for providing a detection signal at an output thereof responsive to the input signal becoming more positive than a predetermined level; and a buffer stage coupled between said output of said detection circuit and a second output for providing a first binary logic state at said second output responsive to said detection signal being applied at the input.

16. The integrated voltage level circuit according to claim 15 wherein said input means includes:

an N-channel enhancement mode transistor having a source coupled to a first supply voltage terminal, a gate coupled to said source of said N-channel enhancement mode transistor, and a drain coupled to the input;

a first resistor coupled between said N-channel enhancement mode transistor and said first supply voltage terminal;

a second resistor coupled between the input and said first output; and a third resistor coupled between the input and said detection means.

17. The integrated voltage level circuit according to claim 16 wherein said N-channel field oxide device transistor of said detection means has a source coupled to said first supply voltage terminal, a gate coupled to said third resistor, and a drain coupled to said ouput of said detection means.

18. The integrated voltage level circuit according to claim 17 wherein said buffer stage includes:

a P-channel enhancement mode transistor having a source coupled to said second supply voltage terminal, a gate coupled to said output of said detection means, and drain; and an N-channel enhancement mode transistor having a source coupled to said first supply voltage terminal, a gate coupled to said gate of said P-channel enhancement mode transistor of said buffer stage, and a drain coupled to said drain of said P-channel enhancement mode transistor of said buffer stage and to said second output.

19. The integrated voltage level circuit according to claim 18 further includes:

a P-channel enhancement mode transistor having a source coupled to a second supply voltage terminal, a gate coupled to said gate of said N-channel field oxide device transistor of said detection means, and a drain coupled to said output of said detection means.

20. In an integrated circuit, a detector circuit for increasing the functionality of the integrated circuit without requiring an increase in the number of terminals of the integrated circuit, comprising:

input means coupled to a terminal of the integrated circuit for transferring a signal applied thereto to a first output of the detector circuit when said signal is representative of predetermined logic levels;

detection means including a P-channel field oxide device coupled to said terminal of the integrated circuit for providing a detection signal at an output thereof whenever said signal becomes more negative than a predetermined negative threshold voltage; and a buffer stage responsive to said detection signal for providing a binary logic signal at a second output of the detector circuit.

21. The detector circuit according to claim 20 wherein said input means includes:

a P-channel enhancement mode transistor having a source coupled to a first supply voltage terminal, a gate coupled to said source of said P-channel enhancement mode transistor, and a drain coupled to said terminal of said integrated circuit;

a first resistor coupled between said drain of said P-channel enhancement mode transistor and a second supply voltage terminal;

a second resistor coupled between said terminal of said integrated circuit and said first output; and a third resistor coupled between said terminal of said integrated circuit and said detection means.

22. The detector circuit according to claim 21 wherein said P-channel field oxide device of said detection means
 is a P-channel field oxide device transistor having a source coupled to said first supply voltage terminal, a gate coupled to said third resistor, and a drain coupled to said output of said detection means.

23. The detector circuit according to claim 22 wherein said buffer stage includes:
 a first P-channel enhancement mode transistor having a source coupled to said first supply voltage terminal, a gate coupled to said output of said detection means, and a drain;
 a first N-channel enhancement mode transistor having a source coupled to said second supply voltage terminal, and a gate and drain coupled to said gate and drain of said first P-channel enhancement mode transistor of said buffer stage, respectively;
 a second P-channel enhancement mode transistor having a source coupled to said first supply voltage terminal, a gate coupled to said drain of said first P-channel enhancement mode transistor of said buffer stage, and a drain; and
 a second N-channel enhancement mode transistor having a source coupled to said second supply voltage terminal, a gate coupled to said gate of said second P-channel enhancement mode transistor of said buffer stage, and a drain coupled to said drain of said second P-channel enhancement mode transistor of said buffer stage and to said second output.

24. The detector circuit according to claim 23 further includes:
 a resistor coupled between said gate of said first P-channel enhancement mode transistor of said buffer stage and said second supply voltage terminal.

25. In an integrated circuit, a detector circuit for increasing the functionality of the integrated circuit without requiring an increase in the number of terminals of the integrated circuit, comprising:
 input means coupled to a terminal of the integrated circuit for transferring a signal applied thereto to a first output of the detector circuit when said signal is representative of predetermined logic levels;
 detection means including an N-channel field oxide device coupled to said terminal of the integrated circuit for providing a detection signal at an output thereof whenever said signal exceeds a predetermined positive threshold voltage; and
 a buffer stage responsive to said detection signal for providing a binary logic signal at a second output of the detector circuit.

26. The detector circuit according to claim 25 wherein said input means includes:
 an N-channel enhancement mode transistor having a source coupled to a first supply voltage terminal, a gate coupled to said source of said N-channel enhancement mode transistor, and a drain coupled to said terminal of said integrated circuit;
 a first resistor coupled between said drain of said N-channel enhancement mode transistor and said first supply voltage terminal;
 a second resistor coupled between said terminal of said integrated circuit and said first output; and
 a third resistor coupled between said terminal of said integrated circuit and said detection means.

27. The detector circuit according to claim 26 wherein said N-channel field oxide device of said detection means
 is a N-channel field oxide device transistor having a source coupled to said first supply voltage terminal, a gate coupled to said third resistor, and a drain coupled to said output of said detection means.

28. The detector circuit according to claim 27 wherein said buffer stage includes:
 a P-channel enhancement mode transistor having a source coupled to a second supply voltage terminal, a gate coupled to said output of said detection means, and a drain; and
 an N-channel enhancement mode transistor having a source coupled to said first supply voltage terminal, a gate coupled to said gate of said second P-channel enhancement mode transistor of said buffer stage, and a drain coupled to said drain of said second P-channel enhancement mode transistor of said buffer stage and to said second output.

29. The detector circuit according to claim 28 further includes:
 a P-channel enhancement mode transistor having a source coupled to said second supply voltage terminal, and a gate coupled to said gate of said drain of said P-channel enhancement mode transistor of said buffer stage, and a drain coupled to said output of said detection means.

* * * * *